(12) United States Patent
Maucher

(10) Patent No.: US 11,867,764 B2
(45) Date of Patent: Jan. 9, 2024

(54) METHOD AND DEVICE FOR CHECKING THE FUNCTIONALITY OF A SOLENOID VALVE

(71) Applicant: Robert Bosch GmbH, Stuttgart (DE)

(72) Inventor: Thorsten Maucher, Heidelberg (DE)

(73) Assignee: Robert Bosch GmbH, Stuttgart (DE)

( * ) Notice: Subject to any disclaimer, the term of this patent is extended or adjusted under 35 U.S.C. 154(b) by 461 days.

(21) Appl. No.: 16/801,316

(22) Filed: Feb. 26, 2020

(65) Prior Publication Data
US 2020/0292618 A1 Sep. 17, 2020

(30) Foreign Application Priority Data
Mar. 13, 2019 (DE) .................. 10 2019 203 421.7

(51) Int. Cl.
*G01R 31/34* (2020.01)
*G01M 13/003* (2019.01)

(52) U.S. Cl.
CPC .......... *G01R 31/34* (2013.01); *G01M 13/003* (2019.01)

(58) Field of Classification Search
CPC .... G01R 19/00; G01R 19/0092; G01R 31/34; G01R 31/343; G01R 31/3842; G01R 11/25; G01R 22/068; G01R 31/2836; G01M 13/00; G01M 13/003; G01M 17/00; B60T 17/22; H01F 7/1844; H01F 2007/185

See application file for complete search history.

(56) References Cited

U.S. PATENT DOCUMENTS

| 6,111,514 A * | 8/2000 | Cossins .................. G01R 31/72 340/654 |
| 6,545,852 B1 * | 4/2003 | Arnold .................... B60T 8/885 361/152 |
| 2019/0156982 A1 * | 5/2019 | Lecheler ............ G01R 31/3274 |

FOREIGN PATENT DOCUMENTS

DE 10 2008 022 953 A1 11/2009

* cited by examiner

*Primary Examiner* — Son T Le
(74) *Attorney, Agent, or Firm* — Maginot, Moore & Beck LLP

(57) ABSTRACT

A method checks a functionality of a solenoid valve for a brake system in a motor vehicle. The solenoid valve includes an armature and a coil. The armature, on actuation of the solenoid valve, is moved by a magnetic field of the coil, reducing an air gap of the solenoid valve defined by a position of the armature. The method includes measuring an electric current during the actuation of the solenoid valve, analysing a characteristic of the electric current during the actuation of the solenoid valve, and assessing the functionality of the solenoid valve based on the analysis of the characteristic of the electric current.

10 Claims, 2 Drawing Sheets

METHOD AND DEVICE FOR CHECKING THE FUNCTIONALITY OF A SOLENOID VALVE

This application claims priority under 35 U.S.C. § 119 to patent application no. DE 10 2019 203 421.7, filed on Mar. 13, 2019 in Germany, the disclosure of which is incorporated herein by reference in its entirety.

The disclosure relates to a method for checking the functionality of a solenoid valve for a brake system in a motor vehicle, the valve comprising an armature and a coil, and the armature, on actuation of the valve, being moved by a magnetic field of the coil, reducing an air gap of the valve defined by the position of the armature. According to the disclosure the method here comprises the following steps: measuring of an electric current during the actuation of the valve, analysis of a characteristic of the electric current during the actuation of the valve, assessment of the functionality of the valve on the basis of the analysis of the characteristic of the electric current. A device which is correspondingly designed to perform the method is also proposed.

BACKGROUND

With the introduction of highly automated driving, greater demands are placed on the availability of the brake system. From SAE J3016 Level 3 onwards, for example, there is a requirement for redundant specification of the deceleration actuator. Both for the primary and for the redundant brake system, it must also be ensured in standby mode that there are no dormant or hidden faults present. In actuators with a hydraulic pump-valve unit, however, sticking valves (for example "stuck closed" or "stuck open") feature in the fault pattern. In the main these faults are detected indirectly by the absence of any build-up in the deceleration.

SUMMARY

The method according to the disclosure, however, advantageously allows a corresponding fault pattern to be detected by a simple test.

According to the disclosure this is made possible by the features specified in the independent patent claims. Further embodiments of the disclosure form the subject of dependent claims.

According to the disclosure a method is provided for checking the functionality of a solenoid valve for a brake system in a motor vehicle, the valve comprising an armature and a coil, and the armature, on actuation of the valve, being moved by a magnetic field of the coil, reducing an air gap of the valve defined by the position of the armature. According to the disclosure the method here comprises the following steps:
  measuring of an electric current during the actuation of the valve,
  analysis of a characteristic of the electric current during the actuation of the valve,
  assessment of the functionality of the valve on the basis of the analysis of the characteristic of the electric current.

This means that the functionality of a valve is not checked indirectly via measurement of the build-up of a hydraulic pressure. Instead, the functionality is determined directly though a measurement of an electrical characteristic variable of the valve. The electric current is used as electrical characteristic variable. It has been ascertained that an actual movement of the valve tappet can be inferred directly from the measured electric current. Thus, in the case of a solenoid valve, upon actuation, i.e. energizing of the valve, the armature is moved and the air gap of the magnet is reduced. This reduction of the air gap gives rise to a variation of the magnetic susceptibility in the coil-armature circuit and produces a current curve. An analysis of this current curve can provide a statement of the functionality of the valve. Thus, given the presence of specific characteristics in the electric current curve, for example, it is possible to assess a functionality correctly with a high degree of probability. The detection of a local maximum might be cited as an example here. In the absence of specific characteristics, on the other hand, it is possible to assume the existence of a fault with a high degree of probability. Alternatively, the existence of a fault may also be detected from inherent specific characteristics of the current value curve.

A characteristic of the electric current is taken to mean, for example, the time curve of the electric current. This may obviously also include isolated values, for example extreme points in the electric current curve. An edit of the measured electric current such as the formation of a rate of variation of the electric current over time, for example, are likewise understood to be characteristics of the electric current.

It is advantageous if the current curve alone is analysed in order to arrive at a statement of the functionality of the valve. That is to say, no other measure variables detected are taken into account here, in particular not the hydraulic pressure.

In an advantageous embodiment of the method no pressure generator for the hydraulic brake system is activated in order to check the functionality of the valve.

This means that no pressure is built up for checking the functionality of the valve. That is to say, only the valve is activated—without any activation of the hydraulic pressure generator. An analysis of the functionality of the valve is therefore performed without analysing the (currently prevailing) hydraulic pressure. This means that the testing of the functionality is not performed as a so-called active test. An active test refers to a test in which, for example, the hydraulic unit actively builds up brake pressure at a specific point in time, the valves are switched accordingly and the pressure prevailing in the wheel brake is measured and analysed. On the basis of the known input data it is then possible to assess from the measured pressure whether the valves are fully functional. Active tests, however, cause the hydraulic load in the actuator to increase over the life of the brake system. Furthermore, active tests take place in the driving comfort range. This leads to increased requirements with regard to the noise, vibration and harshness (NVH). These requirements demand additional cost-intensive damping measures. Active tests are also complex and have strong repercussions on the overall system. The approach described, however, advantageously avoids the necessity for such an active test.

In an advantageous embodiment of the method checking of the functionality of the valve is accordingly performed as a passive test. In particular, checking of the functionality is performed during normal driving of the motor vehicle.

In one possible embodiment of the method the valve is assessed as functional if the characteristic of the electric current during the actuation fulfils a defined condition.

This means that full functionality of the valve to be checked is assumed if the characteristic of the electric current fulfils a defined condition. This may naturally also mean that the characteristic of the electric current has to fulfil multiple defined conditions. All defined conditions advantageously relate to the electric current, however, and are to be verified by way of the measured electric current values.

to In a preferred embodiment of the method the valve is assessed as non-functional if the characteristic of the electric current during the actuation fails to fulfil a defined condition.

This means that a fault is assumed to be present in the valve if a defined condition is not detected in the current value curve. It is not necessary, therefore, for a specific characteristic to be identified in order to assess the existence of a fault. Rather, if a specific condition descriptive of a sound condition is not identified, the existence of a fault is assumed. This serves to increase the confidence.

In an alternative development of the method a rate of variation of the electric current is determined in order to analyse the characteristic of the electric current.

This means that a time derivative of the measured electric current curve is formed. The functionality of the valve is assessed accordingly on the basis of the rate of variation of the electric current.

In an advantageous embodiment of the method the valve is assessed as functional if the rate of variation of the electric current fulfils a defined condition.

This means that a valve is assumed to be functional if a time derivative of the measured electric current curve attains a defined value.

In one possible embodiment of the method the valve is assessed as functional if the rate of variation of the electric current forms a sign reversal.

This means that a valve is assumed to be functional if a time derivative of the measured electric current curve exhibits a zero crossing.

In a preferred development of the method the valve is assessed as functional if the rate of variation attains a defined threshold value, in particular if it attains a defined threshold value following a sign reversal.

This means that a valve is assumed to be functional if a time derivative of the measured electric current curve exhibits a zero crossing and attains a defined negative threshold value.

In an alternative embodiment of the method checking of the functionality is performed at a defined point in time, in particular at the start of an automated drive function of a motor vehicle and/or during the performance of an automated drive function of a motor vehicle.

This means that the actuation of the valve occurs at a defined point in time. The electric current is obviously likewise measured at the defined point in time described.

In a possible development of the method the method comprises the following step: performance of a defined measure on the basis of the assessment of the functionality of the valve.

This means, for example, that a defined measure is performed if the valve is assessed as non-functional. For example, in such a case the valve open-loop or closed-loop control is adjusted throughout the brake system in order to compensate as well as possible for the failure of the valve. Alternatively or in addition to this, a defined drive function may be adjusted. For example, the enablement of a specific automated drive function may be refused, since the valve and thereby the brake system is not fully functioning. As a further measure a fault entry may be logged in the vehicle fault memory. A warning message or other information may obviously also be emitted for the driver and/or third parties.

This method may be implemented, for example, in software or hardware or in a form combining software and hardware, for example in a control unit. The approach presented here furthermore creates a device, which is designed to perform, actuate or implement the steps of a variant of a method described here in corresponding equipment. This design variant of the disclosure in the form of a device also serves to achieve the object of the disclosure rapidly and efficiently.

A device is here taken to mean an electrical unit which processes sensor signals and emits control and/or data signals as a function thereof. The device may comprise an interface, which may take the form of hardware and/or software. In the form of hardware, the interfaces may be part of a so-called system ASIC, for example, which encompasses a variety of functions of the device. It is also possible, however, for the interfaces to consist of separate, integrated electrical circuits or to be composed at least in part of discrete components. In the form of software, the interfaces may be software modules which exist side by side with other software modules on a microcontroller. In this respect the term device may be taken to mean a control unit. It may furthermore also signify a valve which is designed to implement the method. The correspondingly equipped hydraulic unit and/or the brake system may furthermore also be construed as just such a device.

A computer program product or computer program with program code is also advantageous, which may be stored on a machine-readable carrier or storage medium, such as a semiconductor memory, a hard-disk storage or an optical memory, and is used to perform, implement and/or activate the steps of the method according to one of the embodiments described above, particularly if the program product or program is executed on a computer or a device.

BRIEF DESCRIPTION OF THE DRAWINGS

It is to be pointed out that the features cited individually in the description may be combined with one another in any technically suitable manner and set forth further embodiments of the disclosure. Further features and suitable uses of the disclosure emerge from the description of exemplary embodiments, referring to the figures attached, of which

DETAILED DESCRIPTION

Figure 1:
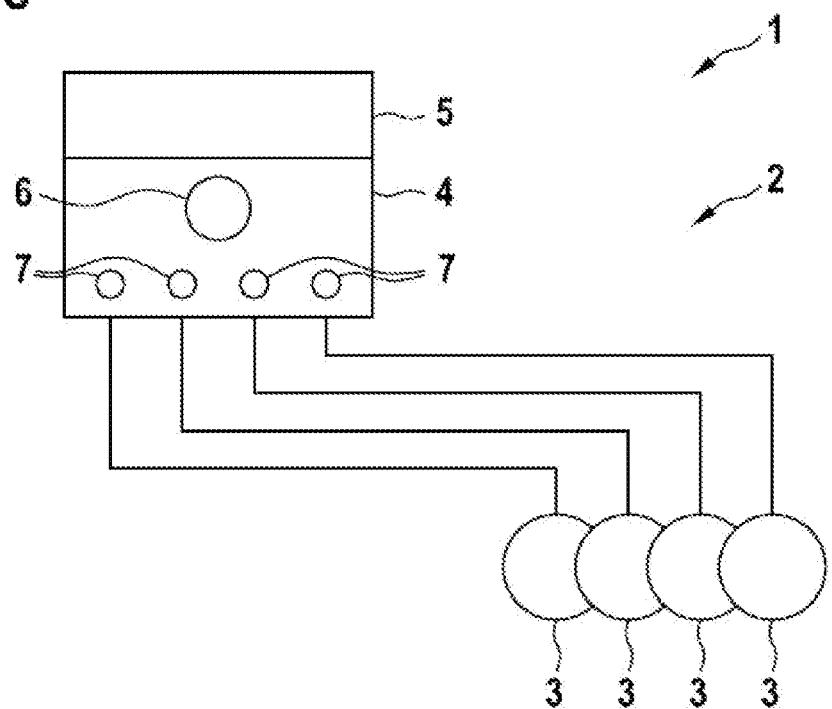
FIG. 1 shows a schematic representation of a hydraulic brake system.

FIG. 1 shows a schematic representation of a hydraulic brake system 2 for a motor vehicle 1, not represented in further detail. The brake system 2 serves for braking the four wheels 3 of the motor vehicle 1. For this purpose, the wheels 3 have hydraulic wheel brakes not represented in further detail. The brake system 2 comprises a hydraulic unit 4 and a control unit 5. The hydraulic unit 4 further comprises a pressure generator 6 and at least one valve 7. The pressure generator 6 is an electric motor, for example, which drives a piston pump. The valves 7 are solenoid valves, for example. These comprise a coil, which on actuation generate a magnetic field. This magnetic field acts on a movable armature, which is moved by the magnetic field from a rest position into a displaced position. The position of the armature defines an air gap in the magnet, for example between the armature and the stator. The magnetic field produces a variation in the position of the armature. This also varies the air gap. For example, the air gap is reduced when the armature is displaced for its unenergized, closed position. The valves may be of normally closed design. Alternatively or in addition, valves may be of normally open design. The design configuration of such valves may differ widely and is not represented here.

Figure 2:
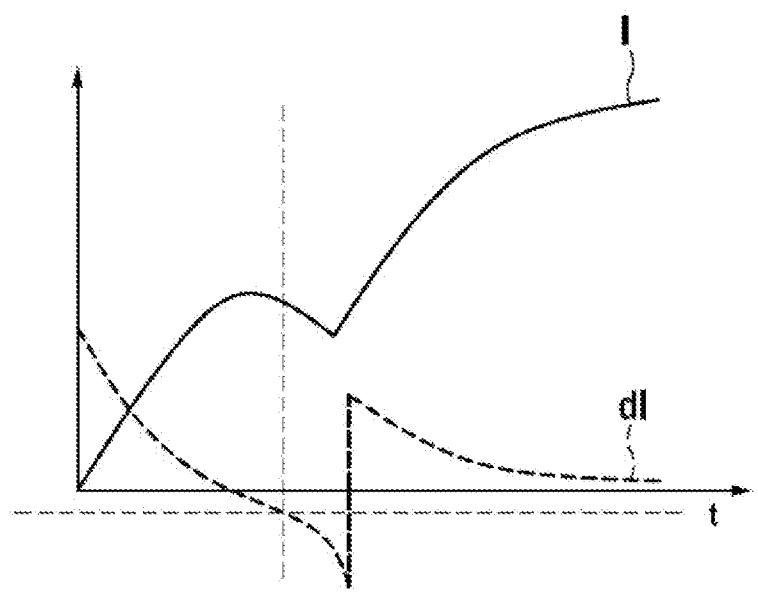
FIG. 2 shows a curve determined for an electric current and its rate of variation during an actuation of a solenoid valve.

FIG. 2 shows a curve determined for an electric current (I) and its rate of variation (dI) over time (t) during an actuation of a solenoid valve. For checking the functionality of the valve, a confirmation (i.e. actuation) of the valve ensues at a defined trigger time. The current is measured and differentiated via high-frequency readout electronics. Actuation causes the armature to move and the valve air gap is closed. This closure gives rise to a variation in the magnetic susceptibility in the coil-armature circuit, which produces a change in the magnetic flux. This correlation gives rise to the characteristic current curve of an actuated seat valve represented in FIG. 2. It can be seen here that at first the electric current rises. Then the curve of the electric current forms a maximum. At this point the rate of variation exhibits a zero crossing—from the positive to the negative. After the first local maximum of the electric current, the electric current falls due to the variation in the magnetic susceptibility. As soon as the air gap is fully closed, a local minimum results in the electric current curve, which then rises gain. The minimum is not a stationary point, since it cannot be differentiated, as the rate of variation shows. In the exemplary embodiment of the method shown a negative threshold value for the rate of variation is defined. This is represented by the dashed line parallel to the horizontal time axis. This threshold value serves to define from what variation in the electric current onwards a functionality of the valve is confirmed, that is to say assumed. It can clearly be seen that at the said point in time the local maximum of the electric current has already been exceeded (see the point of intersection between the dashed vertical line and the current curve line). The defined threshold value therefore forms a type of confidence level, a functionality being assumed only when this confidence level is fulfilled. This improves the validity in analysis of the functionality and avoids false assessments.

Figure 3:
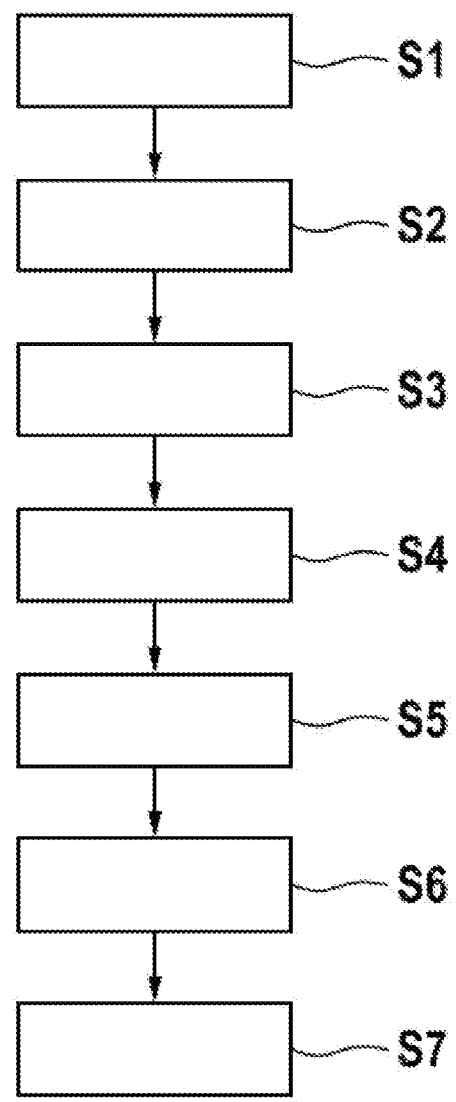
FIG. 3 shows steps in the method according to an exemplary embodiment.

FIG. 3 shows a representation of steps in the method in one embodiment of the disclosure. Here the start of the method for checking the functionality of one or more valves of the hydraulic brake system of a motor vehicle ensues in a first step S1. The start occurs, for example, in reaction to an activation of an automatic drive function of the motor vehicle. Following the start, the valve is actuated, for example by energizing, in a step S2. The actuation of the valve ensues, in particular, without additional activation of a pressure generator in the hydraulic brake system, in particular without simultaneous energizing of the electric motor of the hydraulic pump. Whilst the valve is being actuated, the electric current is measured in a step S3. In the next step S4 there follows an analysis of the measured electric current. Strictly speaking, this involves an analysis of the curve of the measured electric currents. On the basis of this analysis, in a step S5, an assessment is undertaken of whether valve functionality exists or the valve is non-functional. Following the assessment, a defined action can be performed in the next step S6. For example, an activation of an automated drive function is refused, or an automated drive function already activated is deactivated. At the same time the vehicle occupants may obviously also be informed. An entry may also be made in the vehicle fault memory. With step S7 the method is terminated.

What is claimed is:

1. A method for checking a functionality of a solenoid valve for a hydraulic brake system in a motor vehicle, the solenoid valve including an armature and a coil, the method comprising:
   moving the armature, on actuation of the solenoid valve, by a magnetic field of the coil to reduce an air gap of the solenoid valve defined by a position of the armature;
   measuring an electric current during the actuation of the solenoid valve;
   analyzing a characteristic of the measured electric current during the actuation of the solenoid valve, the analyzing including determining a rate of variation of the measured electric current; and
   assessing a functionality of the solenoid valve based on the analysis of the characteristic of the electric current, the assessing of the functionality including assessing the solenoid valve as being functional in response to the rate of variation forming a sign reversal and then subsequently attaining a defined threshold value after the sign reversal.

2. The method according to claim 1, further comprising:
   preventing activation of a pressure generator for the hydraulic brake system in order to check the functionality of the solenoid valve.

3. The method according to claim 1, further comprising:
   assessing the solenoid valve as non-functional when the characteristic of the electric current during the actuation fails to fulfil the defined condition.

4. The method according to claim 1, further comprising:
   checking the functionality at a start of an automated drive function of the motor vehicle and/or during performance of the automated drive function of the motor vehicle.

5. The method according to claim 1, further comprising:
   performing a defined measure based on the assessment of the functionality of the solenoid valve.

6. The method according to claim 1, wherein a device performs the method.

7. The method according to claim 1, wherein a computer program performs the method.

8. The method according to claim 5, wherein, in response to assessing the solenoid valve as non-functional, the defined measure includes adjusting operation of the hydraulic brake system to compensate for the non-functional solenoid valve.

9. The method according to claim 5, wherein, in response to assessing the solenoid valve as non-functional, the defined measure includes disabling an automated drive function.

10. The method according to claim 1, wherein the assessing of the functionality includes assessing the solenoid valve as non-functional in response to the rate of variation failing to form the sign reversal or failing to subsequently attain the defined threshold value after the sign reversal.

\* \* \* \* \*